(12) United States Patent
Miura et al.

(10) Patent No.: US 6,620,704 B2
(45) Date of Patent: Sep. 16, 2003

(54) METHOD OF FABRICATING LOW STRESS SEMICONDUCTOR DEVICES WITH THERMAL OXIDE ISOLATION

(75) Inventors: Hideo Miura, Koshigaya (JP); Makoto Ogasawara, Akishima (JP); Hiroo Masuda, Tokyo (JP); Jun Murata, Kunitachi (JP); Noriaki Okamoto, Ibaraki-ken (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/893,980

(22) Filed: Jun. 29, 2001

(65) Prior Publication Data

US 2002/0093060 A1 Jul. 18, 2002

Related U.S. Application Data

(63) Continuation of application No. 08/838,259, filed on Apr. 17, 1997, now Pat. No. 6,310,384, which is a continuation of application No. 08/270,472, filed on Jul. 5, 1994, now abandoned.

(30) Foreign Application Priority Data

Jul. 2, 1993 (JP) .............................................. 5-188673

(51) Int. Cl.$^7$ .............................................. H01L 21/76
(52) U.S. Cl. ...................... 438/424; 438/449; 438/389; 438/243; 438/248; 257/301
(58) Field of Search ................. 438/424, 449, 438/631, 669, 638, 459, 48, 389, 248, 243; 257/639, 301, 632, 374

(56) References Cited

U.S. PATENT DOCUMENTS

| 4,839,306 A | * | 6/1989 | Wakamatsu .................. 438/424 |
|---|---|---|---|
| 4,842,675 A | | 6/1989 | Chapman et al. ............ 257/397 |
| 4,860,070 A | | 8/1989 | Arimoto et al. ............. 257/396 |
| 4,890,147 A | | 12/1989 | Teng et al. .................. 257/398 |
| 5,079,181 A | | 1/1992 | Shimizu et al. ............... 437/48 |
| 5,258,332 A | * | 11/1993 | Horioka et al. .............. 438/389 |
| 5,293,512 A | * | 3/1994 | Nishigoori et al. .......... 257/622 |
| 5,298,782 A | * | 3/1994 | Sundaresan ................. 257/393 |
| 5,329,138 A | | 7/1994 | Mitani et al. ................ 257/296 |
| 5,332,683 A | | 7/1994 | Miyashita et al. |
| 5,386,131 A | | 1/1995 | Sato ........................... 257/300 |
| 5,428,239 A | | 6/1995 | Okumura et al. ............ 257/371 |
| 5,461,248 A | | 10/1995 | Jun ............................ 257/397 |

FOREIGN PATENT DOCUMENTS

| JP | 3-96249 | 4/1991 | |
|---|---|---|---|
| JP | 3-236283 | 10/1991 | .................. 257/397 |
| JP | 4-127433 | 4/1992 | |

OTHER PUBLICATIONS

Chin et al., "A Bird's Beak Free Local Oxidation Technology Feasible for VLSI Circuits Fabrication", IEEE Transactions on Electron Devices, vol. ED–29, No. 4, 1982, pp. 536–540.

(List continued on next page.)

*Primary Examiner*—David Nelms
*Assistant Examiner*—Long Tran
(74) *Attorney, Agent, or Firm*—Antonelli, Terry, Stout, & Kraus, LLP

(57) ABSTRACT

A method is provided of fabricating a semiconductor device that includes forming a silicon oxide film on a semiconductor substrate. A silicon nitrite film may be formed on the silicon oxide film. A portion of the silicon nitrite film and the silicon oxide film may be removed at a desired portion. Additionally, a groove may be formed in the semiconductor substrate in the portion in which the silicon oxide film is removed. A part of the silicon oxide film may be etched back around the groove with hydrofluoric acid type at the portion in which the silicon nitrite film is located above. Additionally, an oxidized film may be formed in the groove of the semiconductor substrate and the groove may be oxidized.

4 Claims, 14 Drawing Sheets

SECTION OF DEVICE AFTER ETCH-BACK OF PAD OXIDE FILM

OTHER PUBLICATIONS

Magdo et al., "Framed Recess Oxide Schme for Dislocation–Free Planar Si Structures,", Solid–State Science and Technology, vol. 125, No. 6, 1978, pp. 932–6.

Miura et al., "Residual Stress Measurement in Silicon Substrates after Thermal Oxidation", JSME Int'l Journal, Series A, vol. 36, No. 3, 1993, pp. 302–308.

Saito et al., "Development of a Stress Simulation Program for Semiconductor Devices Considering Their Fabricating Process", Computational Mechanics '91, Proc. of Int. Conf. on Comp. Eng. Sci. 1991, pp. 880–883.

Saito et al., "A Two–Dimensional Thermal Oxidation Simulator Using Visco–Elastic Stress Analysis", IEDM, 1989, pp. 695–698.

* cited by examiner

THREE-DIMENSIONAL LOCOS SHAPE

EXAMPLE OF ANALYSIS OF STRESS INCREASING CONDITION AT THE TIME OF FORMATION OF GROOVE

EXAMPLE OF ANALYSIS SHOWING DEPENDENCE OF RESULTING STRESS ON L/S DIMENSION

EXAMPLE OF DESIGN CHART

SECTIONAL VIEW IN DEVICE ISOLATION STEP

PLAN VIEW WHEN FORMING DEVICE ISOLATION REGION

SECTIONAL VIEW TAKEN ALONG LINE VII-VII OF FIG. 6

SECTIONAL VIEW TAKEN ALONG LINE VIII-VIII OF FIG.6

SECTIONAL VIEW TAKEN ALONG LINE IX-IX OF FIG.6

FLOW FOR DETERMINING WIDTH DIMENSION OF DEVICE FORMATION REGION OR DEVICE ISOLATION REGION

SECTIONAL VIEW OF SEMICONDUCTOR DEVICE AFTER GROOVE FORMATION

RELATION BETWEEN ETCH-BACK DISTANCE OF PAD OXIDE FILM
AND MAXIMUM STRESS NEAR GROOVE END

SECTION OF DEVICE AFTER ETCH-BACK OF PAD OXIDE FILM

F I G. 15
MICROGRAPH OF SEMICONDUCTOR CRYSTAL STRUCTURE SHOWING FORMATION EXAMPLE OF DEVICE ISOLATION REGION
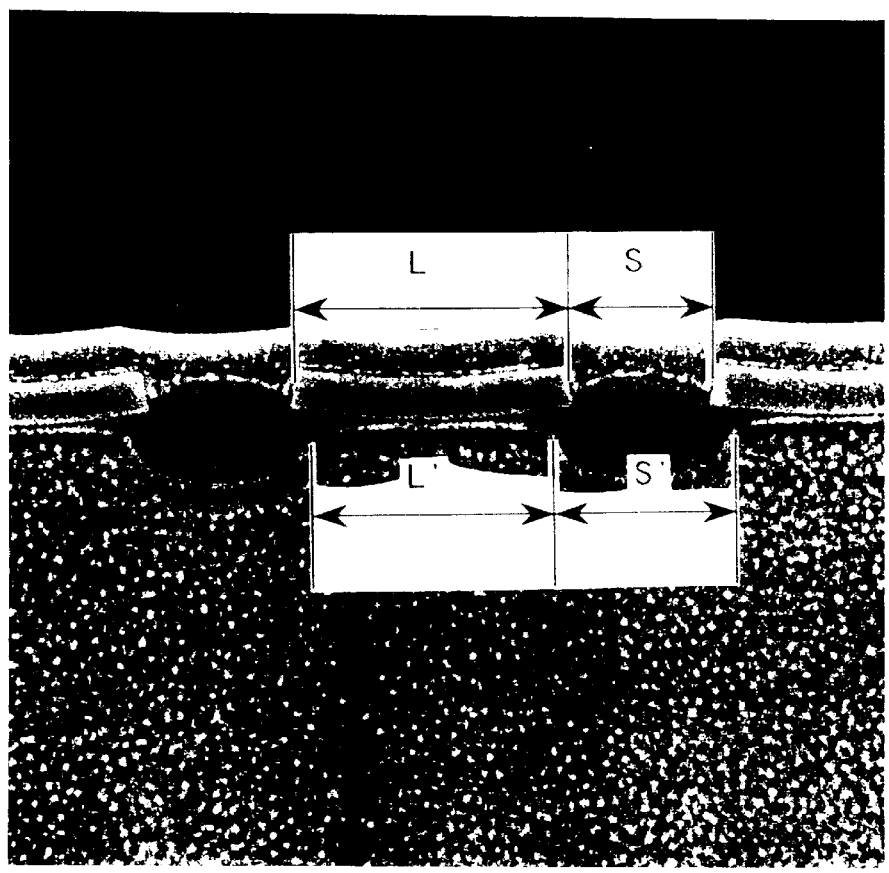

STRESS ANALYSIS STEP

VISCO-ELASTIC MODEL FOR STRESS ANALYSIS

STRESS DISTRIBUTION CHART OF EACH SPECIFICATION $\sigma 1 < \sigma 2 < \sigma 3$

DESIGN SPECIFICATION 1

DESIGN SPECIFICATION 2

DESIGN SPECIFICATION 3

$(\sigma/\sigma_c) > 1$

DESIGN CHART OF DESIGN SPECIFICATION 1

DESIGN SPECIFICATION 1
DESIGN SPECIFICATION 2
DESIGN SPECIFICATION 3

DOT REGION : $(\sigma/\sigma_c) > 1$

COLLECTIVE DESIGN CHART

METHOD OF FABRICATING LOW STRESS SEMICONDUCTOR DEVICES WITH THERMAL OXIDE ISOLATION

This Application is a Continuation Application of Ser. No. 08/838,259 filed Apr. 17, 1997, now U.S. Pat. No. 6,310,384 which is a Continuation of Ser. No. 08/270,472, filed Jul. 5, 1994 which was abandoned Mar. 27, 1997.

BACKGROUND OF THE INVENTION

This invention relates to a semiconductor device as typified by a semiconductor memory device, its fabrication method and its design method. More particularly, the present invention relates to a semiconductor device suitable for a high integration density semiconductor device, its fabrication method and its design method.

In the development of a high integration density semiconductor device, efforts at reducing the size of a device isolation region for electrically isolating adjacent device formation regions has been a critical problem.

A thermal oxide film has been generally used for forming this device isolation region. To locally form the thermal oxide film, a silicon nitride film is deposited on the surface of the device formation region and then a thermal oxidation reaction is carried out.

This thermal oxidation reaction proceeds due to diffusion of an oxidation seed, that is, oxygen or steam vapor, and due to a reaction on the interface between an oxide film and a semiconductor substrate.

Because diffusion of the oxidation seed takes place three-dimensionally, such diffusion is extended also to a location below the silicon nitride film at which location the oxide film is not desired to be formed. Because the shape of growth of the oxide film below the silicon nitride film has a shape of the beak of a bird, it is generally referred to as a "bird's beak". The growth of the bird's beak reduces an area of the device formation region. Therefore, restriction of this growth is important towards accomplishing a high integration density.

To restrict the growth of the bird's beak, a technology which forms grooves on a semiconductor substrate near the end portion of the silicon nitride film and oxidizes the inner wall of the grooves to form the device isolation regions has been developed in the past. A concrete method is described in JP-A-3-96249 and JP-A-4-127433, for example.

The silicon nitride film used as an antioxidation film generally has a great internal stress. Therefore, a high stress occurs in the proximity of the semiconductor substrate surface, too. When a shear stress component (resolved shear stress) in a direction of a slip plane of a crystal exceeds a limit value, dislocation occurs, and electric characteristics of a device are remarkably deteriorated.

The strength of the semiconductor substrate remarkably drops near 1,000° C. at which a thermal oxidation step is carried out in comparison with a temperature near room temperature, and dislocation is extremely likely to occur. Accordingly, stress control is also very important.

In the ordinary thermal oxidation process, a thin thermal oxide film (which will be hereinafter referred to as a "pad oxide film") is first formed on the semiconductor substrate surface so as to protect the semiconductor substrate from the internal stress of the silicon nitride film, and the silicon nitride film is then deposited. The value of the resolved shear stress occurring in the semiconductor substrate below the end portion of the silicon nitride film can be limited to be below the dislocation occurrence limit by controlling the film thickness of this pad oxide film, and the occurrence of dislocation can be thus prevented.

When the grooves are formed on the substrate surface to restrict the growth of the bird's beak, however, the stress field occurring near the substrate surface is likely to change, and the value of the resolved shear stress increases in accordance with the depth of the grooves formed.

FIGS. 2A and 2B of the accompanying drawings illustrate an example of analysis of the relationship between the depth of the groove formed on the substrate surface and the resulting stress. The abscissa in FIG. 2B represents the groove depth (that is, an over-etch quantity D of the substrate) and the ordinate represents the maximum stress (that is, a maximum stress at the mask end).

Incidentally, the ordinate is normalized by a stress value before the formation of the groove. It can be understood that the resulting stress increases due to the formation of the groove. A stress concentration field has existed at only the end portion of the silicon nitride film before the formation of the groove, but when the groove is formed, it also takes place at the lower end portion of the groove formed, too. These two stress concentration fields interfere with each other and eventually increase the resolved shear stress component in the direction of the slip plane on the sidewalls of the groove.

In this instance, there is the case where the resulting stress exceeds the dislocation occurrence limit value with the formation of the groove even when the stress value before the formation of the groove is below the dislocation occurrence limit value. As will be later described, this stress increase has dependence on the pattern dimension. Accordingly, when the grooves are formed on the semiconductor substrate surface, an appropriate counter-measure must be taken lest the increased stress exceeds the dislocation occurrence limit value.

SUMMARY OF THE INVENTION

It is an object of the present invention to provide a device structure, or a groove formation method, which restricts the resulting stress below the dislocation occurrence limit value when the grooves are formed on the semiconductor substrate surface (particularly in the thermal oxidation process).

It is another object of the present invention to provide a semiconductor device structure, and fabrication and design methods thereof, which prevent the occurrence of crystal defects in the thermal oxidation process in a semiconductor production process.

Incidentally, the term "dislocation occurrence limit stress" means a limit value of the stress above which dislocation occurs in the silicon single crystal. The shear stress in the direction of the (111) slip plane of the silicon single crystal is used hereby as the stress, and is generally referred to as the "resolved shear stress".

This stress value changes with a production method of a crystal, with an impurity concentration, with a temperature, and so forth. Therefore, a value corresponding to the material or temperature practically used must be employed.

To accomplish the objects described above, the present invention stipulates the structural dimension so that a ratio of the width of the device formation region to the width of the device isolation region adjacent to the device formation region keeps a predetermined value at which the resulting stress is below the dislocation occurrence limit value.

When the width dimension L, taken from 0.1 to 125 μm, of the device formation region is defined, the width dimension S, taken from 0.1 to 2.5 μm of the device isolation regions so encompassing the device formation region as to correspond to a predetermined groove depth (in which the groove is formed in the device isolation area before the isolation oxide film is formed), is made sufficiently great so that the ratio L/S is below a predetermined value. When the minimum value of the S dimension is defined, the width dimension L of the device formation region adjacent to the device isolation regions is designed so that the ratio L/S is below the predetermined value, by reducing the size of the device formation region or dividing the device formation region.

The structural design can be made by executing stress analysis by using a finite element method, and the L or S dimension is stipulated so that the stress analysis (predicted) value is smaller than the dislocation occurrence limit stress.

Generally, a semiconductor device such as a memory device comprises a memory portion and a peripheral circuit portion as shown in FIG. 16. In the memory portion, very small device formation regions having a size of about 1 μm and having the same shape are periodically arranged with the device isolation regions being interposed between them. In this memory portion, the values of L and S are not greater than about 1 μm in most cases.

In the peripheral circuit portion, on the other hand, considerably greater device formation regions are so arranged as to have the device isolation regions interposed between them. In this case, the shapes of the device formation regions adjacent to one another are not always the same. The values L and S described in the present invention are expressed by the values in the direction in which the S value of the adjacent device isolation region becomes minimal, that is, by the dimension of the major or minor side of the device formation region, and does not use the diagonal direction (e.g. L1, L2 or S1, S2, S3, S4 in FIG. 16). in the peripheral circuit, the L value exceeds several microns (μm) in many cases but the S value is mostly equal to that of the memory portion. Accordingly, the stress value is generally higher in the peripheral circuit portion than in the memory portion.

The value of the resulting stress changes with the internal stress of the silicon nitride film, its thickness, the thickness of the pad oxide film, the groove formation depth and the L/S dimension. The internal stress of the silicon nitride film can be measured from the warp of the silicon substrate, and the thickness of the pad oxide film, too, can be measured.

The groove formation depth and the L/S dimensions are given as the design values. Therefore, structural analysis is possible. Analysis may be made by defining the L/S dimensions while groove formation depth is kept fixed at a predetermined value, or the depth and shape of the groove may be defined from the L/S dimensions.

The internal stress of the silicon nitride film may be measured incessantly during the fabrication process, or a value stored as the data base may be used. The thickness of the silicon nitride film may be measured incessantly, too, or a value determined from the production condition of the film may be stored as the data base and may also be used.

As to the thickness of the pad oxide film, the thickness incessantly measured may be used, or the design (predicted) value determined by the film formation condition may be used as the data base.

The dimension and the depth of the groove are defined by the etching condition. However, as will be later described, there is the case where the stress value greatly changes due to the change of the groove shape in the order of nanometer. Therefore, the value incessantly measured is preferably used, but the value predicted from the etching condition may be converted to the data base and may be used.

Structural analysis may be carried out at the design stage before production, or the dimensions at a next production stage may be determined whenever the measurement values are obtained in the production process. The stress value obtained as a result of analysis is compared with the strength data of the semiconductor substrate, and the L, S design values or the groove shape is adjusted so that the resulting (predicted) stress value does not exceed the strength.

The strength data to be compared with the analytical value may be the data of the experimental data base or the empirical values obtained by comparative examination of the past defective data (occurrence of dislocation) may be used, as well.

When the oxidation process conditions such as the thickness and internal stress of the silicon nitride film, the thickness of the pad oxide film, the groove shape, etc., are fixed, it becomes possible to analyze in advance the resulting stress in accordance with the L and S dimensions. In this case, since the L and S dimensions at which dislocation is expected to occur can be clarified, a design chart representing the dislocation occurrence region is prepared beforehand, and the L and S dimensions can be selected and determined in such a manner as to avoid the danger region, on this chart, at the design stage.

Hereinafter, the outstanding features of the present invention will be explained in accordance with categories.

(Semiconductor Memory Device)

The semiconductor memory device according to the present invention includes a memory portion and a peripheral portion formed on a semiconductor substrate, wherein each of the portions comprises device isolation regions and device formation regions made of a thermal oxide film as a principal constituent material, and wherein a ratio L/S of the width dimension S of the device isolation region and the width dimension L adjacent to one another in the peripheral circuit portion is not greater than an upper limit value which is stipulated by a dislocation occurrence limit stress value inside the semiconductor memory portion, and S is at least 0.1 μm. When S becomes great, the upper limit value drops. The lower limit of S is set to at least 0.1 μm in consideration of the minimum machining dimensional limit of 1-giga DRAMs (hereinafter the same). If the lower limit of S is set to 0, the device isolation region does not exist. Here, the term "peripheral circuit portion" represents the circuit portion which does not store the data in the memory device (hereinafter the same). This peripheral circuit portion must be arranged in such a manner as to satisfy both of the requirements that L is, preferably, as great as possible so as to increase a current capacity while the overall chip size is, preferably, as small as possible.

The value of the ratio L/S of the width dimension L of the device formation region to the width dimension S of the device isolation region adjacent thereto in the peripheral circuit portion described above, is not greater than 50, and S is at least 0.1μ. As to the value 50, refer to FIG. 4.

In the peripheral circuit portion, the ratio L/S of the width dimension L of the device formation region to the width dimension S of the device isolation region adjacent thereto is at least 2. it is desired from the beginning that the memory is fabricated by the minimum possible machining dimension. Accordingly, if S can be machined by 1 μm, for example, it has not been necessary in the past to intentionally set L to 2 μm. tn contrast, the present invention proposes that the value L/S is at least 2 so as to prevent the occurrence of dislocation even by making S small.

The width dimension of the device isolation regions encompassing the device formation regions in the peripheral circuit portion and made of the thermal oxide film as the peripheral constituent material is not smaller than the lower limit value which is defined by the relationship between the width dimension of the device formation region and the dislocation occurrence limit stress value inside the semiconductor memory device.

The width dimension of the device isolation regions encompassing the device formation region in the peripheral circuit portion and made of the thermal oxide film as the principal constituent material is, preferably, at least 0.1 μm.

The width dimension of the device formation region, which is encompassed by the device isolation regions made of the thermal oxide film as the principal constituent material in the periphery circuit portion, is not greater than the upper limit value defined by the relation between the width dimension of the adjacent device isolation region and the dislocation occurrence limit stress value inside the semiconductor memory device.

The width dimension of the device formation region encompassed by the device isolation regions encompassing the device formation region in the peripheral circuit portion and made of the thermal oxide film as the principal constituent material is, preferably, up to 5 μm.

Here, many device isolation regions adjacent to the device formation region L exist around, but the smaller S should be selected. The S width existing on the diagonal line of the device formation region does not merit consideration. For, the width is determined by the shortest dimension encompassing the device formation region.

Incidentally, the silicon nitride film is the one that is formed on the device formation region before thermal oxidation so as to prevent oxidation, and is removed at subsequent steps.

(Stress Analysis Method of Semiconductor Device)

The stress analysis method according to the present invention analyzes the stress occurring in the proximity of the groove formation region from the internal stress of the silicon nitride film and its thickness, the thickness of the pad oxide film, the depth of the groove to be formed in the device isolation region, the width of the device isolation region and the width of the device formation region adjacent to the device isolation region, by numerical analysis means. Here, the numerical analysis means is preferably a finite element method (hereinafter the same).

FIG. 17 shows the outline of the flow of oxidation stress analysis.

A pad oxide film is formed (71) on an initial stage substrate (wafer) by a thermal oxidation method, and a silicon nitride film is formed (72) on the pad oxide film by a CVD method. At this time, an internal stress (σi) of the silicon nitride film is taken into consideration in stress analysis. Next, stress fluctuation when pattern is effected in accordance with the dimensions S, L of the device isolation region and the device formation region is analyzed. In this case, analysis is effected while an over-etch depth D of the substrate occurring at the time of etching is taken into consideration. This state is the initial shape of the oxidation. Thermal stress analysis is made when the overall temperature is raised (74) to the oxidation temperature, and oxidation thermal analysis is thereafter effected.

The structural equation based on a viscoelastic model and used for stress analysis is shown by equation (1), where a is a stress, $\epsilon, \epsilon_\theta$ and $\epsilon_V$ are a strain, a thermal strain and viscous strain, respectively, D is a material moduli matrix, β is a ratio of Young's moduli E1 and E2 in the viscoelastic model, and σi is an intrinsic stress of a thin film, and the detail of the stress analysis using this structural equation is described in the cited reference:

$$\Delta s = (D + \Delta D)(\Delta \epsilon - \Delta \epsilon_q - b\Delta \epsilon_v) + \Delta D \cdot D^{-1}(\sigma - \sigma_i) \quad (1)$$

σ: stress
ε: strain
$\epsilon_\theta$: thermal strain
$\epsilon_v$: viscous strain
D: material moduli matrix
β: ratio of Young's moduli E1 and E2
σi : intrinsic stress.

(Stress Distribution Chart of Semiconductor Device)

A stress distribution chart effective for the present invention represents the stress, which occurs in the proximity of the groove formation region and is determined by using a numerical analysis means from the internal stress of the silicon nitride film, its thickness, the thickness of the pad oxide film, the depth of the groove formed in the device isolation region, the width of the device isolation region and the width of the device formation region adjacent to the device isolation region, by using the device isolation region and the device formation region as parameters.

The stress distribution chart directly plots the stress values of the results of analysis using L and S as the parameters for each process specification as shown in FIGS. 19A to 19C, wherein the abscissa and the ordinate represent L and S. The values of the stress may be written to the chart as numerical data, or the chart may employ the contour line expression. The contour line display may be line data or a region exceeding a predetermined value may be displayed by a color or a pattern as shown in the drawing.

A design chart is prepared by dividing the stress value σ by the dislocation occurrence limit stress value $\sigma_c$ and displaying the regions, in which the quotient exceeds 1, as shown in FIGS. 20A and 20B. Since the occurrence of dislocation is predicted in the display region, a designer using this chart makes dimensional design so that the design dimensions of L and S (their combination) do not fall within this region, or when it is desired to use the dimensions falling within this region, the designer changes the process specification so that the dimension does not fall within the dislocation occurrence prediction region. As shown in the drawings, the display method of the design chart may employ individual display for each process specification, or may collectively display a plurality of process specifications.

Here, the calculation formula of $\sigma/\sigma_c$ can be expressed by the following equation (2), for example:

$$\sigma/\sigma_c = X \quad X \quad X \quad (2)$$

where
tp: thickness of pad oxide film (nm)
tn: thickness of nitride film (nm)
d: over etch depth of silicon substance (nm)

The stress A, which occurs in the proximity of the groove formation region and is determined by the numerical analysis means from the internal stress of the silicon nitride film, its thickness, the thickness of the pad oxide film, the depth of the groove formed in the device isolation region, the width of the device isolation region and the width of the device formation region, is normalized (A/B) by the dislocation occurrence limit stress B of the semiconductor substrate at the highest temperature of the oxidation step, and the region in which the normalization value exceeds 1 and the occurrence of dislocation is predicted is clearly represented by the design chart using the width dimensions of the device isolation region and the device formation region as the parameters. In this case, the move-back (etch-back) distance of the pad oxide film is preferably used as a parameter for representing the dislocation occurrence prediction region. The finite element method is effective for the numerical analysis means.

(Semiconductor Production Apparatus)

The first semiconductor production apparatus according to the present invention comprises means for measuring the thickness of the pad oxide film, the thickness of the silicon nitride film and its internal stress, respectively, an arithmetic unit for effecting numerical analysis by using the measurement values, and the design values of the width of the device formation region and the width of the device isolation region adjacent to the device formation region, a display device or a data display matter such as paper for displaying the design chart described above, and decides the substrate groove formation depth at the time of removal of the silicon nitride film before selective oxidation. Here, the form may be an apparatus of one package, or may be the form of a discrete system having each function.

The second semiconductor production apparatus according to the present invention comprises means for measuring the thickness of the pad oxide film, the thickness of the silicon nitride film and its internal stress, respectively, means for measuring the width of the device formation region and the width of the device isolation region adjacent to the device formation region, means for measuring the depth of the groove formed in the substrate surface at the time of removal of the silicon nitride film before selective oxidation, an arithmetic unit for effecting stress analysis by using the measurement results, a memory device for preserving design strength data (design chart or stress distribution chart), and means for deciding and displaying the move-back (etch-back) distance of the pad oxide film at which dislocation does not occur at the time of selective oxidation, by comparing the results of analysis with the strength data (see dimension B in FIG. 2A).

(Design Method of Semiconductor Device)

In the semiconductor device according to the present invention, the design method of the semiconductor device comprises a step of effecting stress analysis by using the thickness of the pad oxide film, the thickness of the silicon nitride film and its internal stress, and the substrate groove formation depth at the time of removal of the silicon nitride film before oxidation, and a step of deciding (A) the width of the device formation region and the width of the device isolation region adjacent to the device formation region, and/or (B) the groove formation depth.

(Fabrication Method of Semiconductor Device)

(A) The fabrication method of the present invention includes a step of effecting stress analysis by using the thickness of the pad oxide film, the thickness of the silicon nitride film and its internal stress, the width dimension of the device formation region, the width dimension of the device isolation region adjacent to the device formation region, and the depth of the groove formed on the substrate surface at the time of removal of the silicon nitride film before selective oxidation, and a step of deciding the move-back (etch-back) distance of the pad oxide film at which dislocation does not occur at the time of selective oxidation and etching back the pad oxide film.

(B) The pad oxide film is etched back by at least 4 nm before the thermal oxidation step.

(C) Stress (numerical) analysis is effected by using the thickness of the pad oxide film, the thickness of the silicon nitride film and its internal stress, the width of the device formation region and the width of the device isolation region adjacent to the device formation region, and the substrate groove formation depth at the time of removal of the silicon nitride film before selective oxidation can be thus determined.

(D) The width dimension of the device isolation region or the width dimension of the device formation region is determined so that the stress, which occurs in the proximity of the groove formation region and is determined by the numerical analysis means by using the internal stress of the silicon nitride film and its thickness, the thickness of the pad oxide film, the depth of the groove formed in the device isolation region, the width of the device isolation region and the width of the device formation region adjacent to the device isolation region, is not higher than the dislocation occurrence limit strength.

(E) The width dimension of the device isolation region encompassing the device formation region and made of the thermal oxide film as the principal constituent material is set to be not lower than the lower limit value which is defined by the thickness of the silicon nitride film and its internal stress, the thickness of the pad oxide film, the depth of the groove formed on the substrate surface, and the relation between the width of the device formation region and the dislocation occurrence limit stress value inside the semiconductor device.

(F) The width dimension of the device formation region encompassed by the device isolation region made of the thermal oxide film as the principal constituent material is set to be not higher than the upper limit value which is defined by the thickness of the silicon nitride film and its internal stress, the thickness of the pad oxide film, the depth of the groove formed on the substrate surface, and the relation between the width dimension of the adjacent device isolation region and the dislocation occurrence limit stress value.

(Semiconductor Device)

In the semiconductor device according to the present invention, the device formation region preferably has a width dimension of at least 4 $\mu$m and the width dimension of the device isolation region encompassing the device formation region and made of the thermal oxide film as the principal constituent material is preferably at least 1 $\mu$m.

The smaller the S dimension and the greater the L dimension, the more likely becomes the resulting stress to increase. In the example shown in FIG. 3B, for example, when the S dimension is 2 $\mu$m, the resulting stress exceeds the dislocation occurrence limit stress in the region in which the L dimension is at least 2 $\mu$m. When the S dimension is 4 $\mu$m, on the other hand, it is when the L dimension is at least 4 $\mu$m that the resulting stress exceeds the dislocation occurrence limit.

Accordingly, when the dimensions and the arrangement of the device isolation region and the device formation region are designed, either one of the L and S dimensions can be determined first, and then the other is designed to the dimensional region in which dislocation does not occur.

From this aspect, each of the inventions described above sets the ratio of the width dimension of the device formation region to that of the device isolation region adjacent to the former to the value at which the resulting stress is below the dislocation occurrence limit value.

BRIEF DESCRIPTION OF THE DRAWINGS

FIG. 15 is a micrograph of a crystal structure of a semiconductor, and shows an example of formation of a device isolation region in an embodiment of the present invention;

DESCRIPTION OF THE PREFERRED EMBODIMENTS

Hereinafter, preferred embodiments of the present invention will be explained with reference to the accompanying drawings. First, the principle of the present invention will be explained.

Figure 3A:
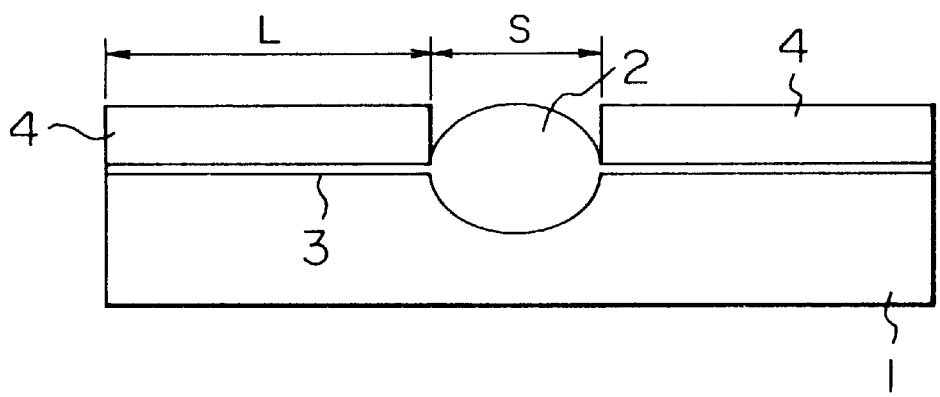
FIGS. 3A and 3B are explanatory views useful for explaining an example of analysis of dependence of a resulting stress on an L/S dimension in an embodiment of the present invention.
Figure 3B:
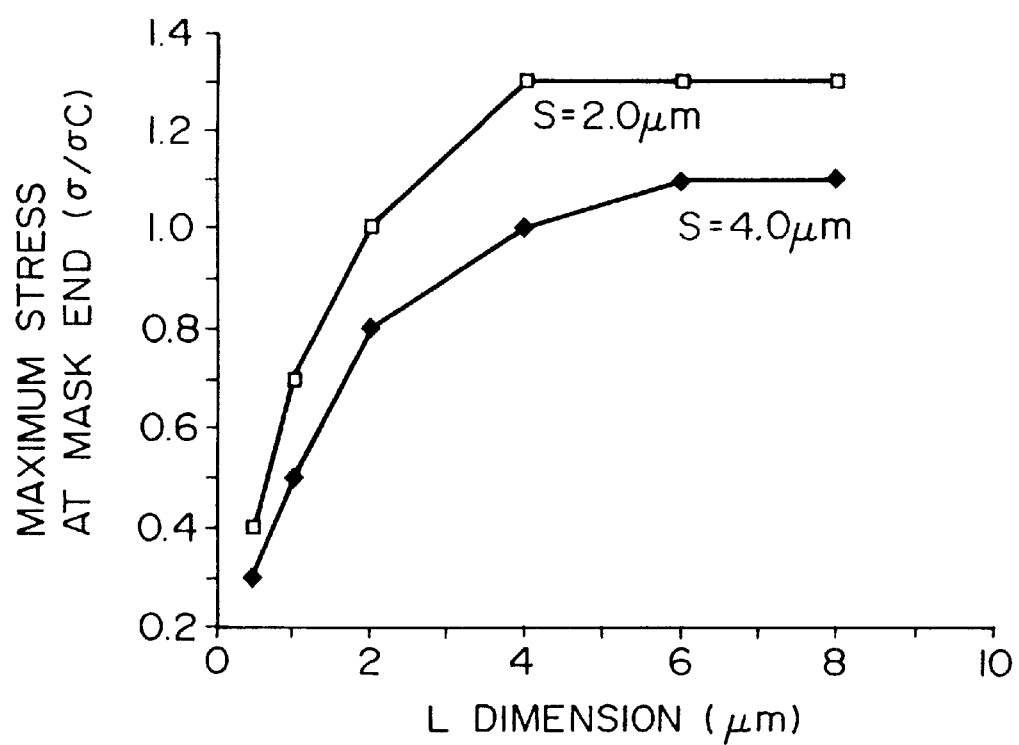

Let us consider the case where a groove having a width S is formed in a direction parallel to a <110>crystal axis on a silicon crystal (100) plane orientation substrate 1 before thermal oxidation, as shown in FIG. 3A. FIG. 3B shows an example of analysis of a predicted value of a resulting stress when a thermal oxide film 2 is formed under the condition where a groove formation depth is 10 nm, an internal stress of a silicon nitride film 4 is 1,500 MPa, its thickness is 150 nm and the thickness of a pad oxide film 3 is 10 nm, by using L and S dimensions of a device formation region as parameters.

The abscissa in FIG. 3B represents the L dimension (unit: $\mu$m) and the ordinate represents a maximum value of a resolution shear stress component in the proximity of the groove in the direction of a (111) crystallographic plane as a slip plane of the silicon single crystal substrate. However, the ordinate is normalized by a dislocation generation limit intensity of the silicon substrate at 1000° C.

Generally, the resulting stress tends to increase when the S dimension is small and the L dimension is great. This analytical example reveals that when the S dimension is 2 $\mu$m, the resulting stress exceeds the dislocation generation limit stress in the region of the L dimension of at least 2 $\mu$m at which $\sigma/\sigma_c=1$ on the other hand, when the S dimension is 4 $\mu$m, it is when the L dimension is at least 4 $\mu$m that the resulting stress exceeds the dislocation generation limit.

To design the dimensional arrangement of the device isolation region and the device formation region, therefore, it is necessary to first determine either the L dimension or the S dimension and then to design the other to a dimensional region in which dislocation does not occur. However, there are the cases where the dimension is set to a region in which fabrication of the thin film is difficult, and in such cases, the balance of the overall dimension must be adjusted.

Figure 2A:
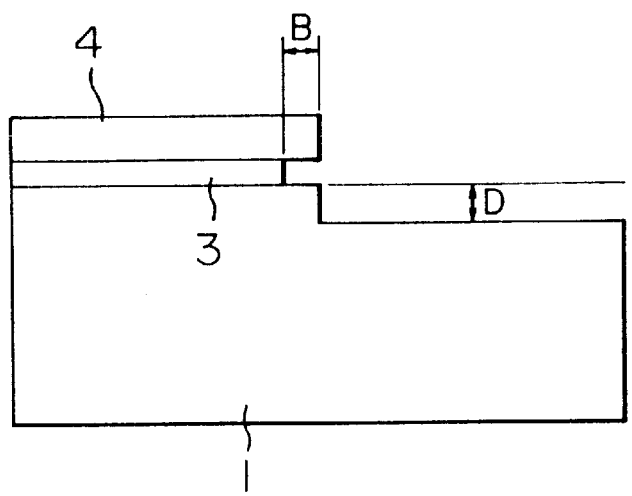
FIGS. 2A and 2B are explanatory views useful for explaining an example of analysis of a stress increasing state when a groove is formed in an embodiment of the present invention.

Further, the resulting stress changes in accordance with the groove formation depth, too, as has already been explained with reference to FIGS. 2A and 2B. Therefore, when the adjustment of the L dimension or the S dimension is difficult, the groove formation depth is preferably reduced. in this way, the dislocation occurrence region can be reduced and a designable region can be explained.

Figure 4:
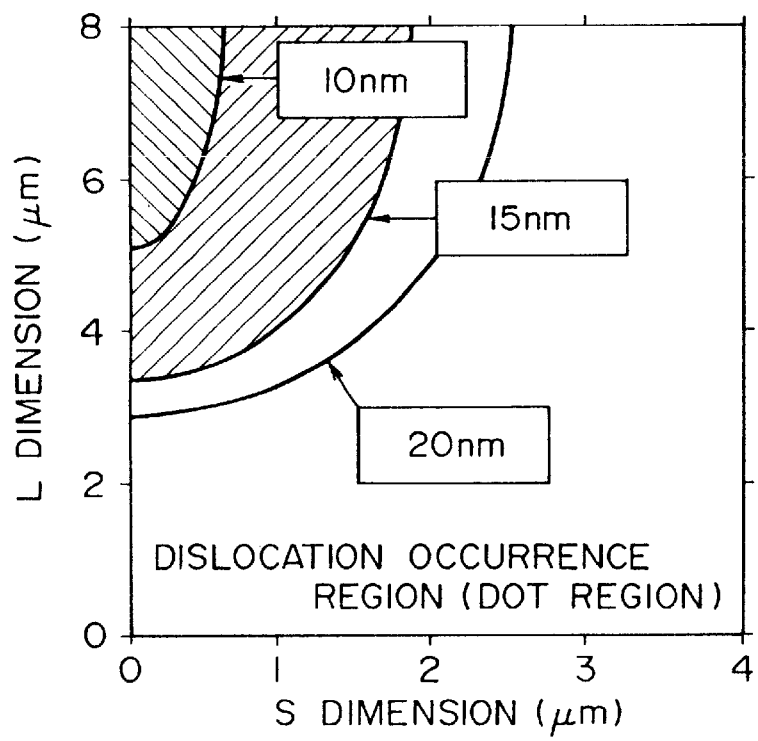
FIG. 4 is a design chart according to an embodiment of the present invention.

FIG. 4 shows an example of design chart preparation for a suitable design for preventing the occurrence of dislocation on the basis of this analytical example. The abscissa in the diagram represents the S dimension and the ordinate represents the L dimension. In the diagram, hatching represents the regions in which the occurrence of dislocation is predicted. The diagram represents an analytical example using the groove formation depth as a parameter. When the groove formation depth increases from 10 nm to 20 nm, the dislocation occurrence pattern region expands, as can be seen from the diagram. According to this chart, design may be carried out by selecting the combination of the L/S dimensions which inhibits the occurrence of dislocation when the groove formation groove is fixed. When the L/S dimension is fixed, on the contrary, a groove depth which inhibits the occurrence of dislocation at that dimension may be adopted as a process design value.

When the fabrication process is fixed, it becomes possible to design in advance the L dimension and the S dimension of the device formation region and the device isolation region adjacent to each other to the combination of the values which inhibits the occurrence of dislocation, at a product pattern design stage, by preparing such a design chart. In this way, the occurrence of dislocation at the fabrication stage can be prevented, and the drop of the yield of the products can be prevented, as well.

The stress analysis or the preparation of the design chart is possible if the conditions of the thermal oxidation process (such as the internal stress and thickness of the silicon nitride film, the thickness of the pad oxide film, the groove formation depth, etc.) used in the practical fabrication process of the products are clarified. In consideration of the practical fabrication process, it is known that fabrication variance (tolerance) always exists. Accordingly, design must be so made at the design stage as to secure a process margin to a certain extent by taking this variance into consideration.

On the spot of actual fabrication, it is possible to change or correct the design value of a next step by following the fabrication steps and measuring the actual values. In other words, the thickness of the pad oxide film is first measured, and any error from the design value is confirmed. When the thickness of the pad oxide film is greater than the design value, the design margin to the stress increases. Therefore, there is no critical problem, in particular. However, when the thickness is smaller, the resulting stress increases. Accordingly, oxidation is additionally carried out so as to correct the film thickness to a predetermined value, or warning is given to subsequent steps.

Next, the internal stress is measured (from warp of the wafer, for example) after deposition of the silicon nitride film, and a difference from the set value (predicted value) at the initial design stage is grasped. When the measured value is smaller than the set value, there is no particular problem because the design margin to the stress increases.

When the internal stress is higher, however, the quantity of increment of the stress occurring at the time of formation of the groove, inclusive of the data of the thickness of the pad oxide film of the preceding stage, must be examined once again.

The next groove formation depth is corrected in accordance with the result of evaluation. In this way, the occurrence of dislocation can be prevented, and the present invention can be effectively applied to the site of actual fabrication.

Incidentally, there may be the case where the correction value of the groove depth is improper for reasons other than the stress. In such a case, the silicon nitride film is once removed and is then deposited once again, or the silicon nitride film is partially removed so as to reduce the film thickness, or the fabrication of that lot is cancelled. Which of these counter-measures is to be taken is decided in consideration of the fabrication cost, and so forth.

In any of these cases, fabrication can be continued without permitting the occurrence of dislocation in vain, so that the drop of yield as well as the increase of the cost can be prevented.

A thin pad oxide film 3 is formed on a semiconductor substrate (Si wafer) by thermal oxidation (which deposits an oxide film by exposure to an oxidizing atmosphere), and then a silicon nitride film is uniformly deposited. Thereafter, a part of the pad oxide film is removed locally and selectively with a part of the silicon nitride film. At this time, a part of the silicon substrate is removed simultaneously, too (see FIG. 13). Next, only the remaining pad oxide film 3 is etched back (FIG. 13) and then a thick oxide film 2 is formed on the groove of the substrate 1 as shown in FIG. 3.

EXAMPLE 1

FIGS. 1 to 5 show the first example of the present invention.

Figure 1:
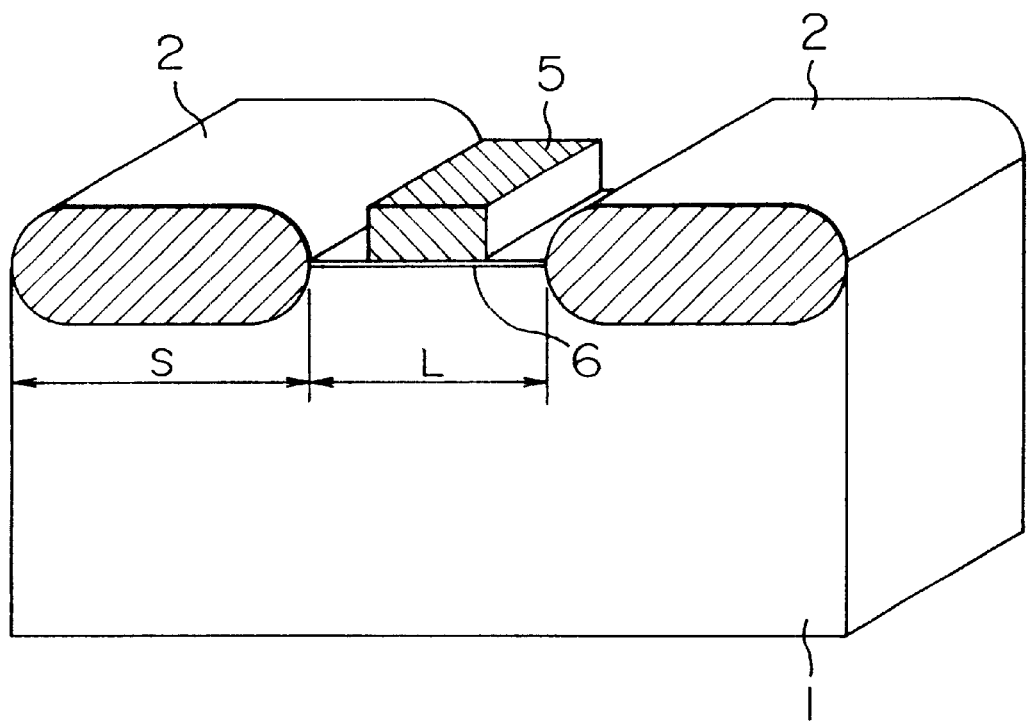
FIG. 1 is a schematic view of a three dimensional LOCOS shape.
Figure 5:
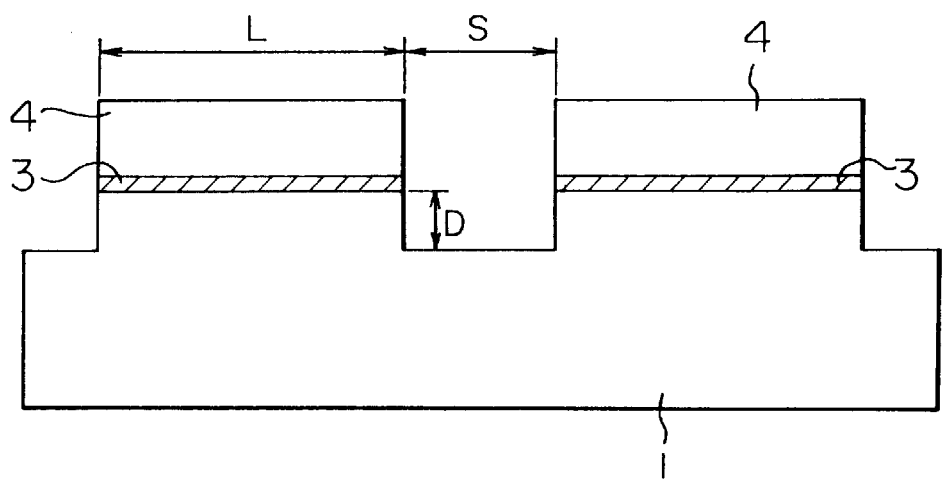
FIG. 5 is a schematic sectional view showing a sectional dimension of a device isolation step in an embodiment of the present invention.

FIG. 1 shows the structure of an MOS transistor employing a device isolation structure of the semiconductor device according to the present invention. In this example, the device isolation region is formed into a stripe form. FIG. 5 shows an initial sectional shape at the time of formation of the device isolation region. FIGS. 2A and 2B shows an example of analysis of the relation between the groove depth at the time of the initial shape formation and a maximum value of the stress occurring in the substrate in the proximity of the lower end of the silicon nitride film. FIG. 4 shows an example of a design chart obtained by analyzing the stress occurring due to the combination of the dimension of width S of the device isolation region and the dimension of width L of the silicon nitride film by using the groove formation depth as a parameter, and representing the dislocation occurrence region from the relationship with the substrate intensity.

In this example, a shallow groove shown in FIG. 5 is formed in the silicon substrate surface of the region in which the device isolation structure is formed. This shallow groove may be formed either intentionally, or may be formed unavoidably when the silicon nitride film is removed. Though the thickness of the silicon nitride film and the thickness of the pad oxide film are assumed to be 150 nm and 15 nm, respectively, the present invention is not necessarily limited to this combination.

Figure 2B:
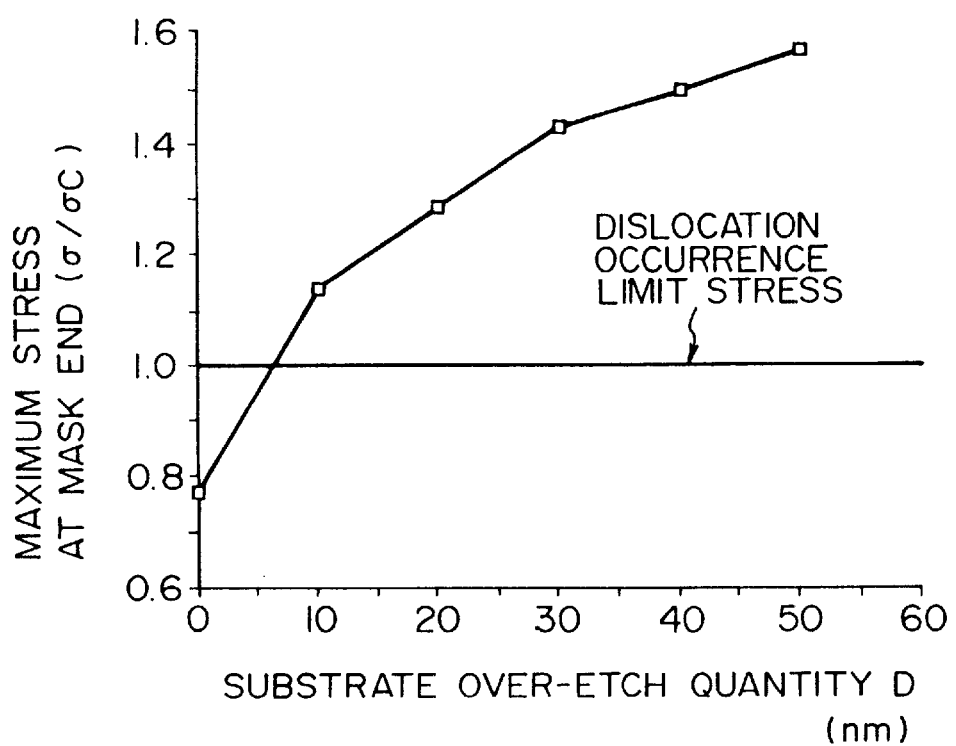

When such a shallow groove is formed, the stress of the silicon substrate surface near the silicon nitride film increases in accordance with the groove depth as shown in FIG. 2B. It can be understood from FIG. 2B that when the groove formation depth exceeds about 6 nm, the value of the resulting stress exceeds the dislocation occurrence limit stress at the formation temperature of the device isolation oxide film. This phenomenon depends on the combination of a width L dimension of an arbitrary device isolation formation region and its gap S dimension, and the increase of the stress has dependence on the L and S dimensions. An analytical example of this dependence is shown in FIGS. 3A and 3B.

FIG. 3B shows analytical examples where the gap width of the device isolation regions is assumed to be 2 $\mu$m and 4 $\mu$m. When the gap of the device isolation regions is 2 $\mu$m, for example, the value of the resulting stress exceeds the dislocation occurrence limit stress at the formation temperature of the device isolation oxide film in the groove depth region of at least 2 $\mu$m, and when the gap is 4 $\mu$m, the resulting stress exceeds the dislocation occurrence stress when a groove of at least 4 $\mu$m is formed.

FIG. 4 shows a region, in which the occurrence of dislocation is predicted, when analysis is effected by the combination of an arbitrary L dimension (dimension of the device formation region) or an S dimension (dimension of device isolation regions). The abscissa in FIG. 4 represents the S dimension and the ordinates does the L dimension. The hatched regions represents those regions in which the resulting stress is expected to exceed the dislocation occurrence limit stress at the formation temperature of the device isolation oxide film.

Accordingly, in the structure shown in FIG. 1, the combination of the L dimension and the S dimension is, selected so as not to enter the hatched regions in FIG. 4. When the S dimension is defined, the L dimension is so selected as not to enter the hatched region and when L dimension is defined, the S dimension is so selected as not to enter the hatched regions.

When both of the L and S dimensions do not fall within a desired range, the groove formation depth is adjusted. In other words, since the dislocation occurrence region becomes narrower with a smaller groove formation depth, the application range of the L and S dimensions can be expanded.

In this example, it is possible to design in advance the L dimension and the S dimension of the device formation region and the device isolation region adjacent to one another to the combination of the values which does not generate dislocation at the product pattern design stage. Accordingly, the occurrence of dislocation at the fabrication process as well as the drop of the yield of the product can be prevented.

SECOND EXAMPLE

Figure 6:
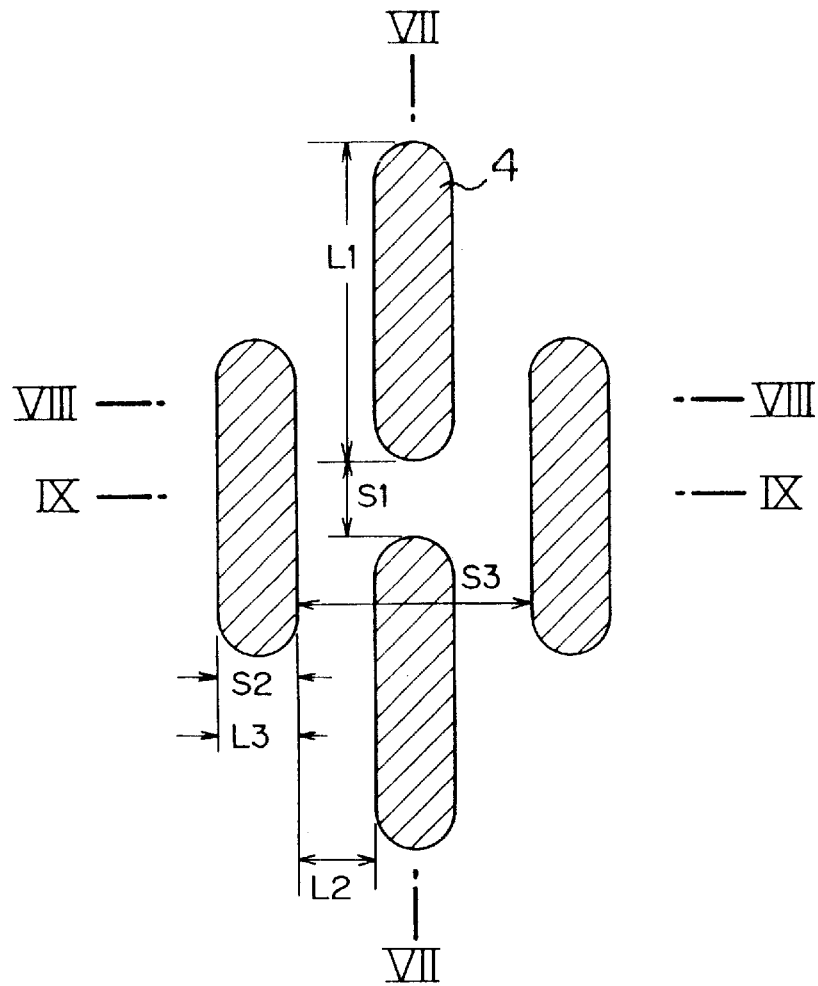
FIG. 6 is a plan view of formation of a device isolation region in an embodiment of the present invention.

The second example of the present invention will be explained with reference to FIGS. 6 to 9 and FIG. 15. FIG. 6 is a plan view showing a device isolation oxide film formation region of the semiconductor device in this example, FIG. 7 is a sectional view taken along a line VII—VII of FIG. 6, FIG. 8 is a sectional view taken along a line VIII—VIII of FIG. 6, FIG. 9 is a sectional view taken along a line IX—IX of FIG. 6, and FIG. 15 shows an example of device isolation oxide film formation corresponding to a region along a line VIII—VIII.

In this example, device isolation regions are formed in such a manner as to encompass a device formation region as shown in FIG. 6. Incidentally, though each device isolation region in this example is shown shaped into an elliptic shape, it need not be elliptic but may be an arbitrary shape.

Though FIG. 6 shows four device isolation regions, the number of device isolation regions need not be limited to 4 but may be an arbitrary number. Further, the shape of the device isolation regions need not be the same, and their arrangement (the gaps between the device isolation regions and their mutual positional relationship) need not be particularly limited.

Figure 7:
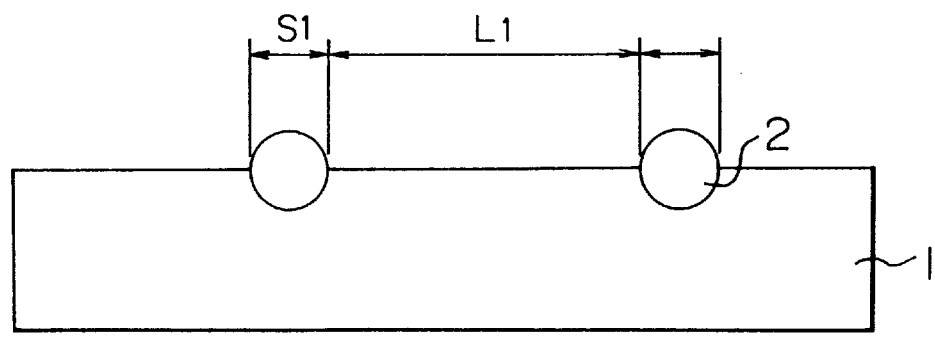
FIG. 7 is a sectional view taken along a line VII—VII of FIG. 6.
Figure 8:
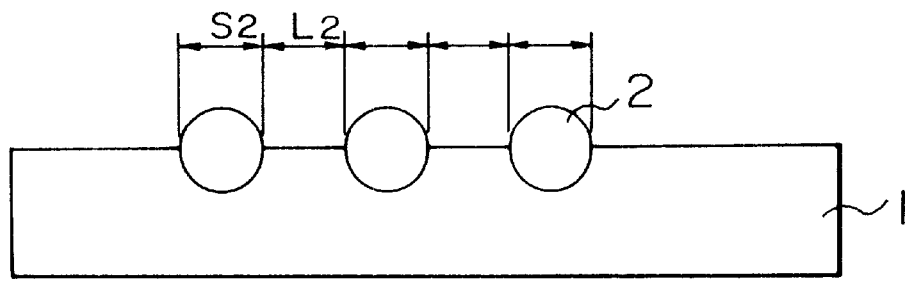
FIG. 8 is a sectional view taken along a line VIII—VIII of FIG. 6.
Figure 9:
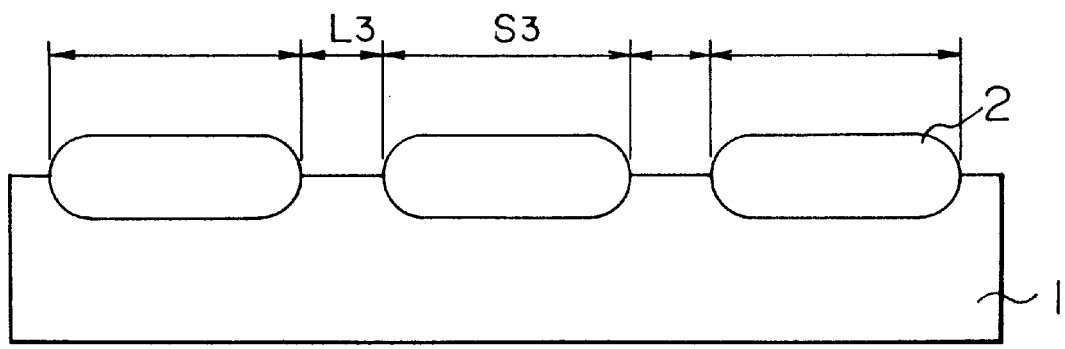
FIG. 9 is a sectional view taken along a line IX—IX of FIG. 6.

When the sectional views of FIGS. 7 and 8 are compared with each other in this example, the S dimension is the same but the L dimension in FIG. 7, that is, the L dimension along line VII—VII in FIG. 6, is greater.

Accordingly, when the depth of the groove formed during the formation of the device isolation regions (which groove may be formed intentionally or may be formed unavoidably as has been explained in the first example) is constant in the planar region of FIG. 6, the resulting stress in the region along the line VII—VII having a greater L dimension is greater than the resulting stress of the region along the line VIII—VIII because the S dimension is constant.

On the other hand, when the sectional view along the line IX—IX shown in FIG. 9 is compared with the sectional view along the line VII—VII shown in FIG. 7, the S dimension is greater in the section along the line IX—IX and the L dimension is smaller. Accordingly, in the three sections described above, it can be understood from FIG. 3 or 4 that the resulting stress at the position along the line VII—VII becomes maximum.

Accordingly, when the dimension of the device isolation structure is decided in this example in such a manner that the resulting stress in the section along the line VII—VII is below the dislocation occurrence limit, the stress occurring in other regions is always below this value, and the trouble of the occurrence of dislocation in the device isolation step can be eliminated. Accordingly, the design chart is prepared in accordance with the groove formation depth by the procedures described in the first example and shown in FIG. 3 or 4, and the L and S dimensions may be suitably selected in the region in which dislocation does not occur.

When the desired L and S dimensions cannot be obtained at a predetermined groove depth, the groove formation depth is reduced so that the combination of the desired L and S dimensions does not fall within the dislocation occurrence region.

When the device isolation regions have arbitrary shapes or when an arbitrary number of device isolation regions exist, too, design may be made in such a manner that the position at which the resulting stress attains maximum (basically, the position at which the L/S ratio is the greatest) is clarified among the combinations of the device formation region width L and the device isolation region width S adjacent to one another, and the S and L dimensions or the groove formation depth is selected so that the resulting stress at that position is below the dislocation occurrence stress.

Incidentally, the design values of the device formation region width dimension L and the device isolation region width S shown in FIG. 15 are different from the actual values, and the L dimension is small while the S dimension is great. This is because the oxidation reaction proceeds due to three-dimensional diffusion of the oxidation seed and consequently, the oxidation reaction unavoidably proceeds below the silicon nitride film, too.

The present invention stipulates the silicon nitride film width to L and the gap between the adjacent silicon nitride films to S as shown in FIG. 15, but includes also L' and S' dimensions which permit the substantial change of about 0.1 $\mu$m, for example, as the dimensional change due to three-dimensional diffusion of the oxidation seed. In this example, the L and S dimensions of the device formation region and the device isolation region adjacent to one another can be designed in advance at the product pattern design stage to the combination which does not permit the occurrence of dislocation. Therefore, the occurrence of dislocation at the fabrication stage and the drop of yield can be prevented.

THIRD-EXAMPLE

The third example of the present invention will be explained with reference to FIGS. 10 to 14.

Figure 10:
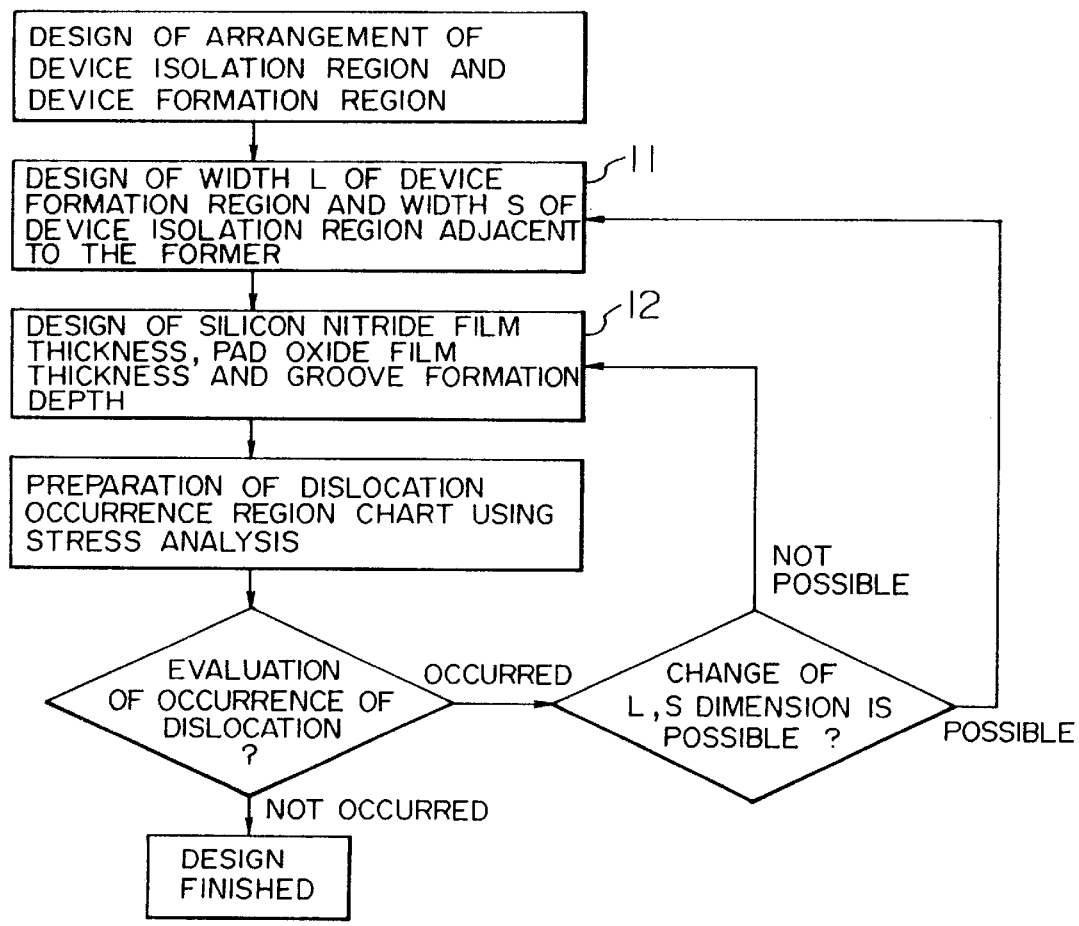
FIG. 10 is a flow chart showing a method of deciding a width dimension of a device formation region or of a device isolation region in an embodiment of the present invention.
Figure 11:
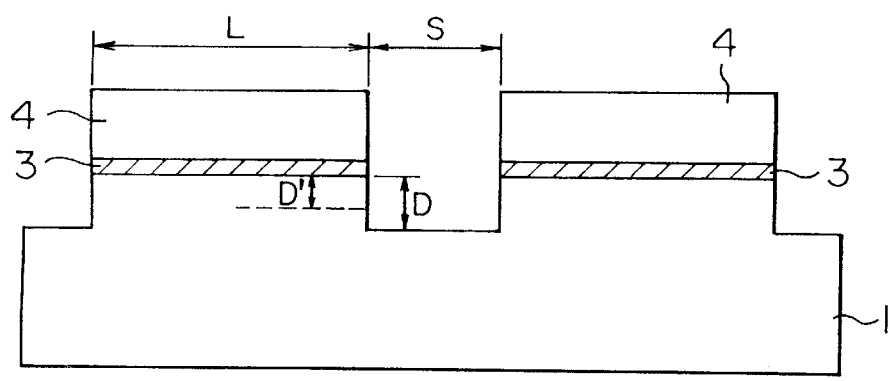
FIG. 11 is a schematic view showing a sectional structure of a semiconductor device after formation of a groove in an embodiment of the present invention.
Figure 21:
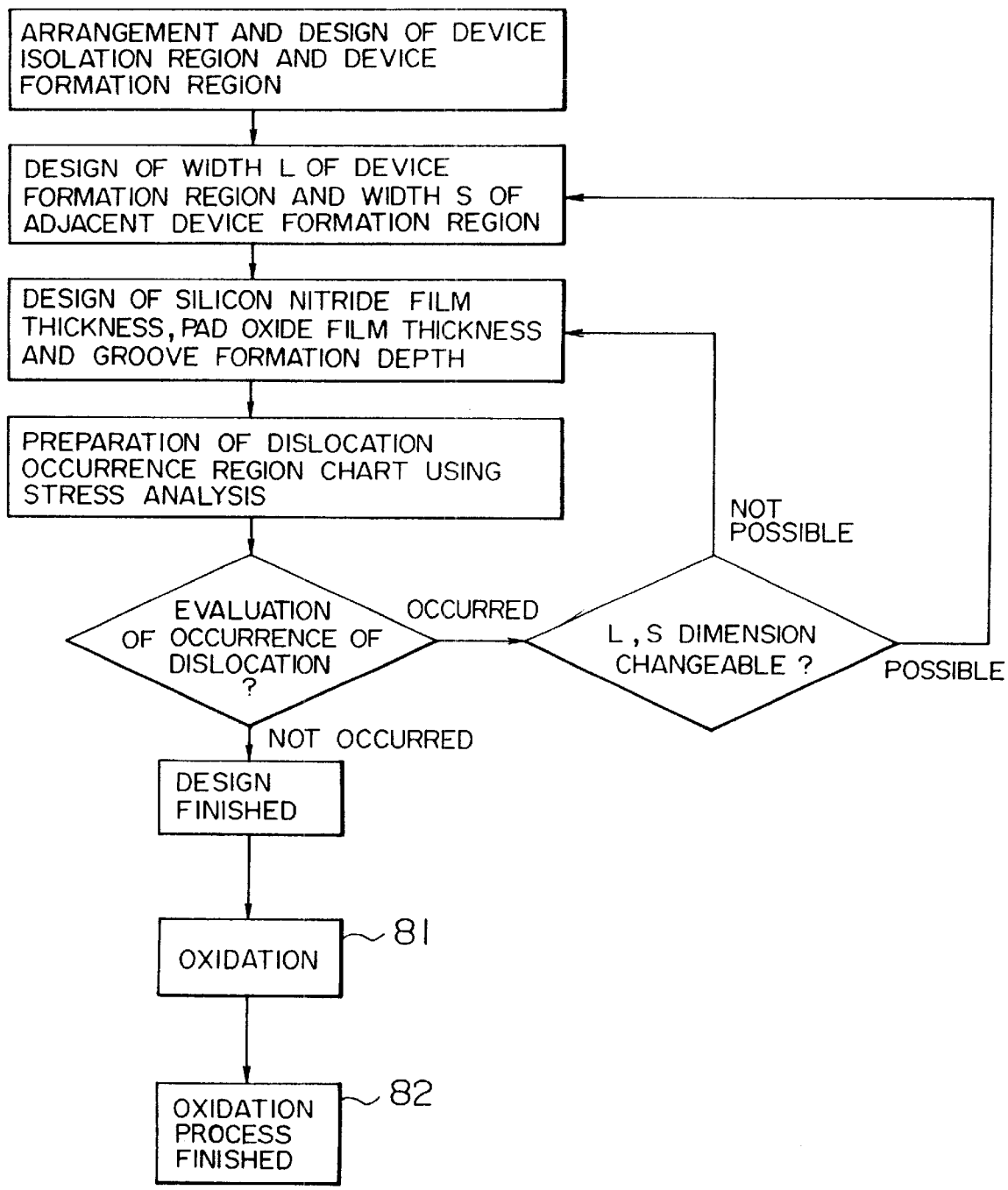
FIG. 21 is a flow chart showing a design process and a fabrication process of a semiconductor using stress analysis.

FIG. 10 is a flow chart representing the procedures for determining the width L (silicon nitride film width L) of the device formation region and the width S of the device isolation oxide film formation region adjacent to the former for preventing the occurrence of dislocation described in the first or second example of the present invention, and the groove depth D formed in advance in the region in which the device isolation oxide film is formed. FIG. 11 is a sectional view when the semiconductor device designed in accordance with the flow chart and fabricated in practice through the oxidation step 81 and the oxidation end step 82 shown in FIG. 21.

Figure 12:
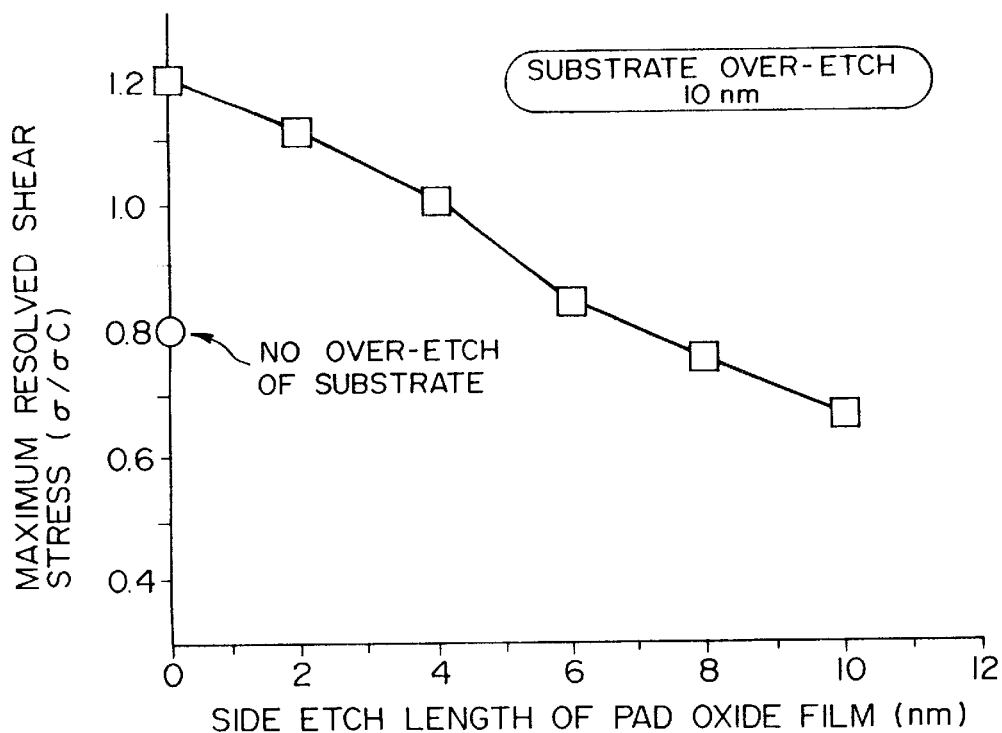
FIG. 12 is a characteristic diagram useful for explaining the relationship between etch-back distance of a pad oxide film and a maximum stress near a groove end portion in an embodiment of the present invention.

FIG. 12 shows the result of analysis of the relationship between the move-back distance of the pad oxide film as a counter-measure for mitigating the stress when the groove formation depth is greater than the design value, and the resulting stress in the proximity of the groove end portion.

Figure 13:
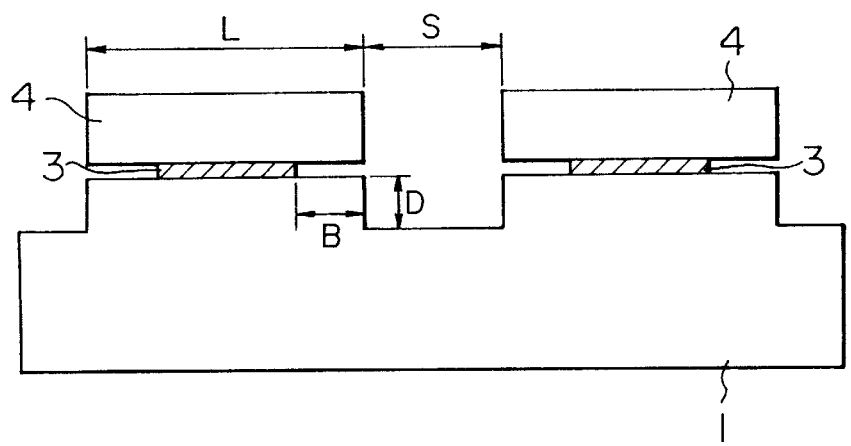
FIG. 13 is a schematic view showing a sectional structure of the device after etch-back of the pad oxide film in an embodiment of the present invention.

FIG. 13 shows the sectional structure after the pad oxide film is moved back by etching so as to practically reduce the resulting stress below the dislocation occurrence limit.

Figure 14:
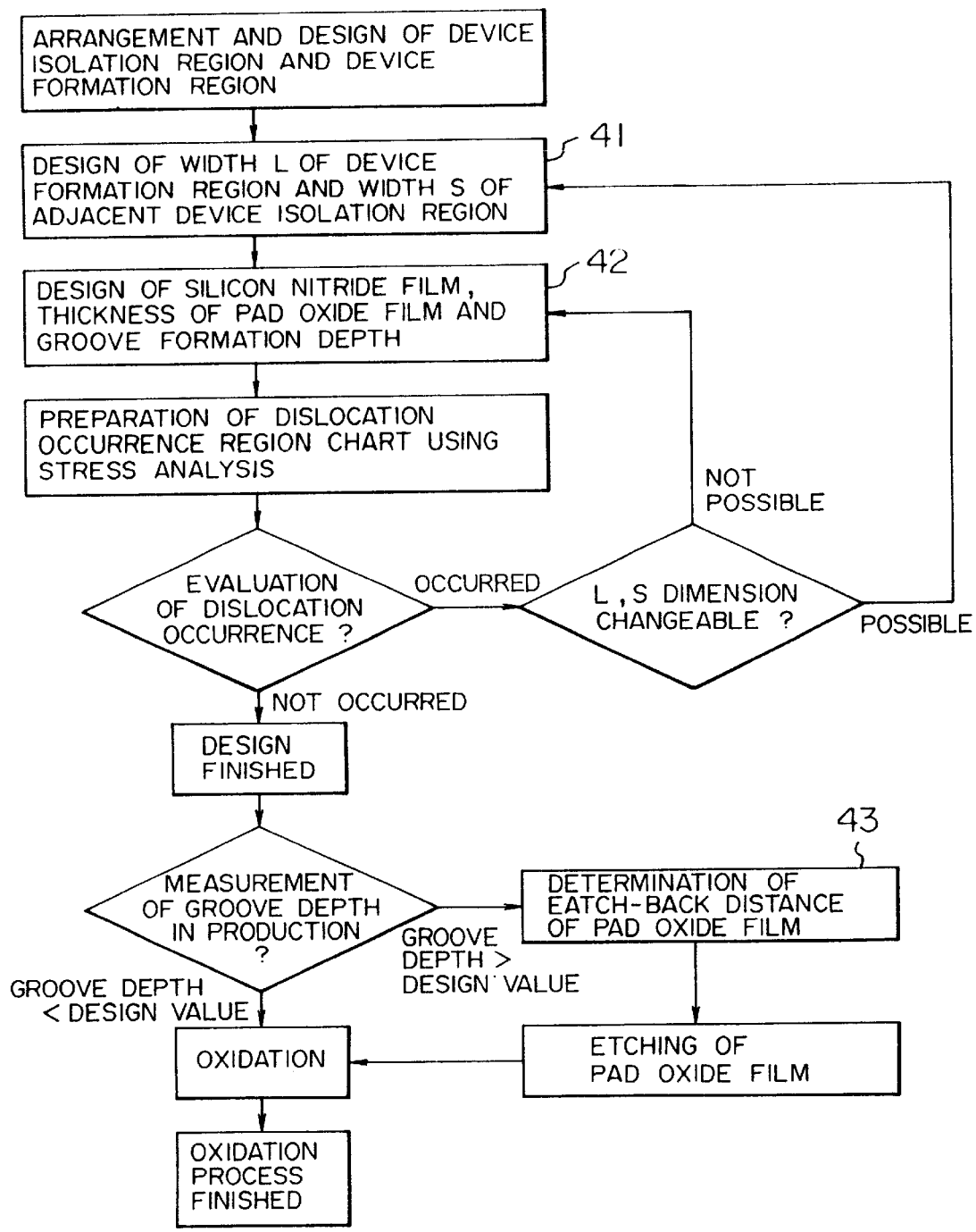
FIG. 14 is a flow chart showing a method of deciding a width dimension of a device formation region or of a device isolation region in consideration of a groove formation depth in an embodiment of the present invention.
Figure 16:
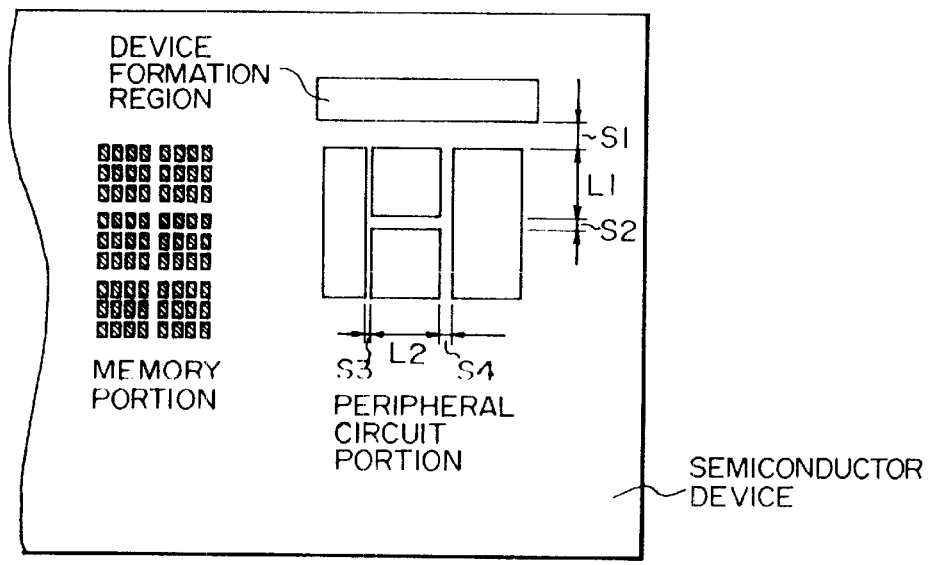
FIG. 16 is a schematic view showing an S dimension and an L dimension in a peripheral circuit inside a semiconductor memory device.
Figure 17:
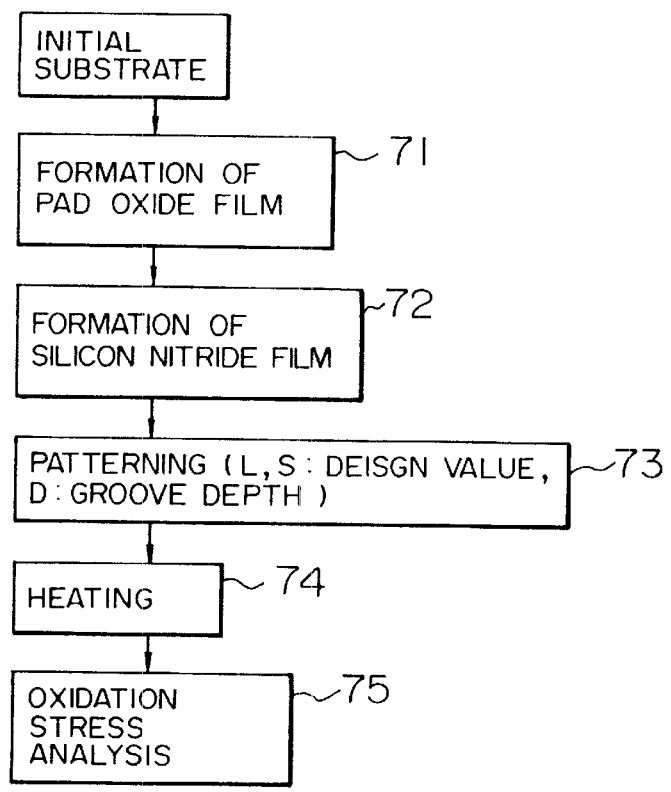
FIG. 17 is a flow chart showing steps of stress analysis.
Figure 18:
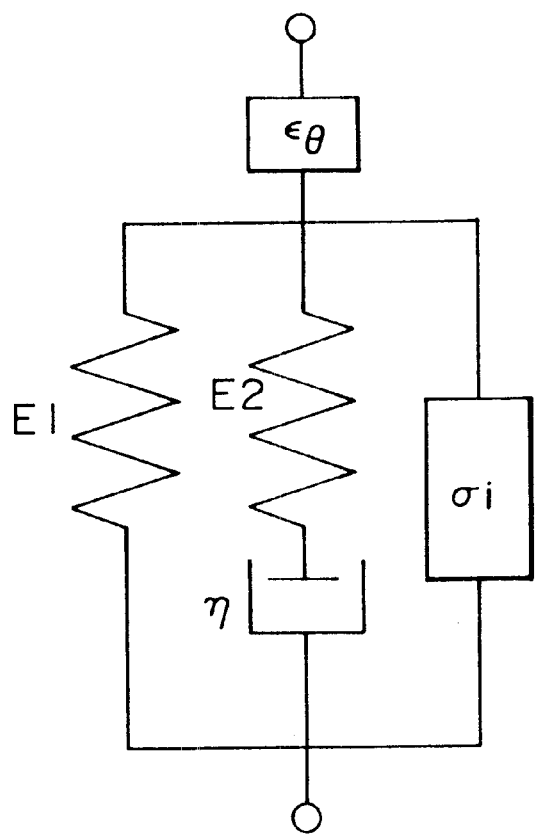
FIG. 18 is a circuit diagram showing a viscoelastic model for stress analysis.
Figure 19A:
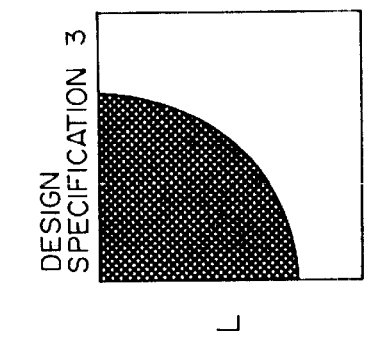
FIGS. 19A to 19C are stress distribution charts.
Figure 19B:
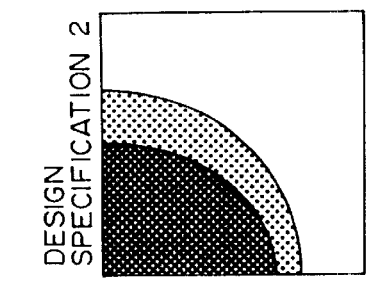
Figure 19C:
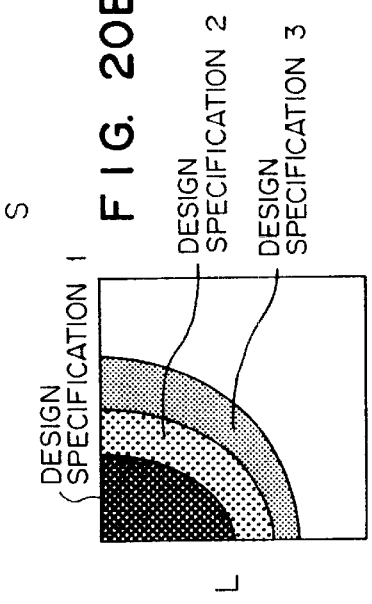
Figure 20A:
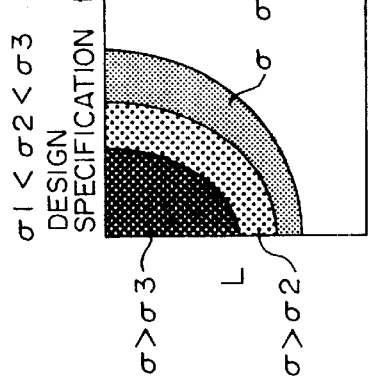
FIGS. 20A and 20B are design charts.
Figure 20B:
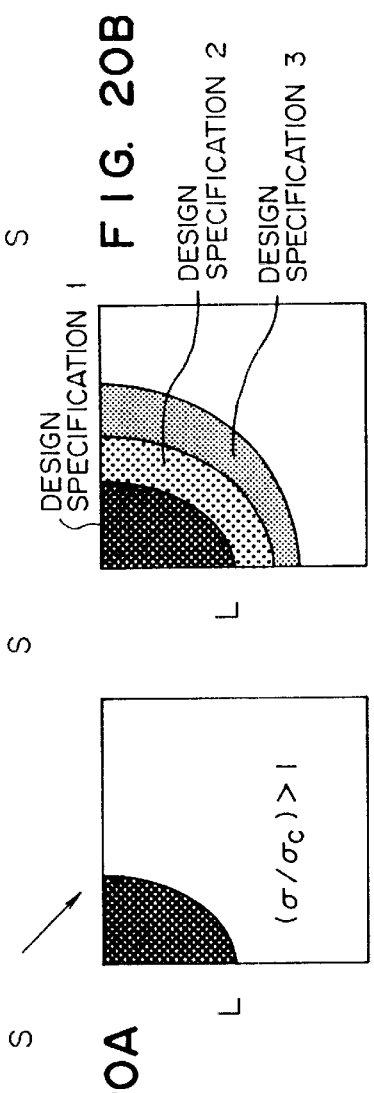

FIG. 14 is a flow chart representing the procedures for determining the width L (silicon nitride film width L) of the device formation region and the width S of the device isolation oxide film formation region adjacent to the former, in consideration of the case where the groove formation depth is different from the design value, the groove depth D formed in advance in the region in which the device isolation oxide film is formed, and the move-back distance B of the pad oxide film when the pad oxide film is etched back as one of the counter-measures.

As represented by the first or second example, the width dimension of the device formation region and that of the device isolation oxide film region adjacent to the device formation region can be designed by determining the dimensions and arrangement in accordance with the flow chart shown in FIG. 10 so that dislocation does not occur. However, fabrication cannot always be made in accordance with the design dimensions on the actual fabrication site because machining tolerance exists and characteristics of machines change with time depending on the environment of use.

As an example, FIG. 11 shows the sectional structure of the semiconductor device in which the groove depth formed actually in the fabrication process exceeds the design value. The conventional fabrication method involves the problem that if the oxidation process as such is continued, dislocation always occurs. Therefore, there is no way but to discard the intermediate products when the actual groove depth exceeds the design value at the groove depth measurement stage. It has been clarified, however, that when the pad oxide film is partially etched back as a new counter-measure against the stress, the occurrence of dislocation can be prevented.

FIG. 12 shows an example of analysis of the relationship between the move-back distance of the pad oxide film and the maximum stress at the groove end portion. In this example, the design value of the groove formation depth is 10 nm, whereas it is formed actually into the depth of 15 nm. The abscissa in the drawing represents the move-back distance of the pad oxide film and the ordinate represents the maximum stress near the groove end portion.

Because the groove formation depth proves to be 15 nm, the resulting stress exceeds the dislocation occurrence limit stress value, but stress mitigation can be accomplished by moving back the pad oxide film and thus dispersing the stress concentration position. In other words, when the pad oxide film is moved back, the end of the pad oxide film serves as a point for supporting the stress of the silicon nitride film. Accordingly, the portion near the upper end of the groove is released from the stress from the silicon nitride film, and the stress becomes zero.

Since the distance between the end of the pad oxide film and the stress concentration position at the lower end of the groove becomes great, too, the influences of mutual interference become smaller and eventually, the degree of stress concentration formed in the vicinity of the groove side wall becomes lower, and stress mitigation can be thus accomplished.

It can be understood that in this example, the resulting stress can be again limited below the dislocation occurrence limit by moving back the pad oxide film by about 4 nm More concretely, FIG. 13 shows an example of the sectional structure when the pad oxide film is moved back. The design and the procedures for determining the counter-measure method are shown in the flow chart of FIG. 14. The pad oxide film can be etched back by an etching solution of a hydrofluoric acid type. The etch-back quantity can be controlled by an etching time by measuring in advance the etching rate.

As is obvious from FIG. 12, the greater the etch-back distance of the pad oxide film, the higher becomes the stress mitigation effect. Accordingly, it is better to set the etching time to a longer time with some margins (to an etch-back distance of at least 6 nm, for example) than to set it to the exact time for accomplishing the stress mitigation (the etch-back of 4 nm in this example).

Incidentally, since the etch-back distance of the pad oxide film depends on the groove depth, the value 4 nm illustrated in this example is not always optimal and the optimum dimension must be decided in accordance with the actual structural dimension. According to this example, the L and S dimensions of the device formation region and the device isolation region adjacent to the former can be designed in advance at the product pattern design stage to the combination which does not cause dislocation, and even when the groove formation depth becomes greater than the design depth in the actual fabrication stage, the occurrence of dislocation at the fabrication stage can be prevented by adding an etching process which etches back the pad oxide film by a suitable distance. In this way, the drop of yield of the product can be prevented.

In the semiconductor devices, the present invention can design in advance the L and S dimensions of the device formation region and the device isolation region adjacent to the former at the product pattern design stage to the combination of the values which do not invite the occurrence of dislocation, can thus prevent the occurrence of dislocation at the fabrication stage and can eventually prevent the drop of yield of the products.

What is claimed is:

1. A method of fabricating a semiconductor device comprising the steps of:

forming a silicon oxide film on a semiconductor substrate;

forming a silicon nitride film on said silicon oxide film;

removing a portion of said silicon nitride film and said silicon oxide film at a desired portion;

forming a groove in said semiconductor substrate in the portion in which said silicon oxide film is removed;

etching-back a part of said silicon oxide film around said groove with hydrofluoric acid type at the portion in which said silicon nitride film is located above;

forming an oxidized film in said groove of said semiconductor substrate; and oxidizing said groove of said semiconductor substrate.

2. A method of fabricating a semiconductor device comprising the steps of:

forming a silicon oxide film on a semiconductor substrate;

forming a groove in said semiconductor substrate;

etching-back a part of said silicon oxide around said groove by 4 to 10 nm from an end portion of thereof within said groove; and oxidizing said groove of said semiconductor substrate.

3. A method of fabricating a semiconductor device having a circuit region and a device isolation region comprising the steps of:

forming a silicon oxide film on a semiconductor substrate;

forming a silicon nitride film on said silicon oxide film;

removing a portion of said silicon nitride film and said silicon oxide film within said device isolation region;

forming a groove in said semiconductor substrate;

etching-back a part of said silicon oxide film around said groove at the portion in which said silicon nitride film is located; and forming an oxidized film in said groove of said semiconductor substrate.

4. A method of fabricating a semiconductor device having a circuit region and a device isolation region comprising the steps of:

forming a silicon oxide film on a semiconductor substrate;

forming a silicon nitride film on said silicon oxide film;

removing a portion of said silicon nitride film within said device isolation region;

forming a groove in said semiconductor substrate;

etching-back a part of said silicon oxide film away around said groove at the portion under said silicon nitride film; and forming an oxidized film in said groove of said semiconductor substrate.

* * * * *